(12) United States Patent
Sato et al.

(10) Patent No.: US 6,716,530 B2
(45) Date of Patent: Apr. 6, 2004

(54) RESIN COMPOUND FOR FABRICATING INTERLAYER DIELECTRIC OF PRINTED WIRING BOARD, RESIN SHEET AND RESIN APPLIED-COPPER FOIL FOR FORMING INSULATION LAYER USING THE RESIN COMPOUND, AND COPPER-CLAD LAMINATE USING THEM

(75) Inventors: Tetsuro Sato, Ageo (JP); Tsutomu Asai, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 22 days.

(21) Appl. No.: 09/996,802

(22) Filed: Nov. 30, 2001

(65) Prior Publication Data

US 2002/0106516 A1 Aug. 8, 2002

(30) Foreign Application Priority Data

Dec. 8, 2000 (JP) ........................................ 2000-374070

(51) Int. Cl.⁷ .................... B32B 27/38; B32B 15/08; C08L 63/00
(52) U.S. Cl. ...................... 428/416; 428/413; 428/414; 428/418; 428/901; 525/523
(58) Field of Search ............................ 428/413, 414, 428/416, 418, 901; 528/87, 88, 93, 94, 106, 107; 525/403, 405, 406, 407, 523

(56) References Cited

U.S. PATENT DOCUMENTS 5,674,611 A    10/1997   Saida et al.
5,932,637 A  *  8/1999   Ito et al. ..................... 523/451

FOREIGN PATENT DOCUMENTS

| EP | 0843509 A1 | 5/1998 |
| JP | 08-253559 A | 1/1996 |
| JP | 11-005828 A | 1/1999 |
| JP | 11-140281 A | 5/1999 |

* cited by examiner

*Primary Examiner*—Robert Dawson
*Assistant Examiner*—Michael J Feely
(74) *Attorney, Agent, or Firm*—Rothwell Figg Ernst & Manbeck

(57) ABSTRACT

The present invention provides a resin applied-copper foil, which is free of halogen elements, having high flame retardancy, excellent water resistance, heat resistance, and good peeling strength between a base material and copper foil. To provide the a resin compound used for fabricating an interlayer dielectric of a printed wiring board, the resin compound comprises an epoxy-based resin which includes: an epoxy resin curing agent having 5 to 25% by weight of nitrogen; and maleimide compounds having thermosetting properties, and the resin compound further has composition which is free of halogen elements.

21 Claims, No Drawings

RESIN COMPOUND FOR FABRICATING INTERLAYER DIELECTRIC OF PRINTED WIRING BOARD, RESIN SHEET AND RESIN APPLIED-COPPER FOIL FOR FORMING INSULATION LAYER USING THE RESIN COMPOUND, AND COPPER-CLAD LAMINATE USING THEM

TECHNICAL FIELD

The present invention relates to resin applied-copper foil which is capable of manufacturing a printed wiring board without employing component materials of an insulating layer such as a prepreg, and to a copper-clad laminate and a printed wiring board which are excellent in flame retardancy.

BACKGROUND ART

A copper-clad laminate used for manufacturing a printed wiring board which is widely used in electric and electronic products is generally manufactured by employing the so-called prepreg, the prepreg being made by the impregnation of a glass cloth, kraft paper, a nonwoven glass fabric or the like with a thermosetting resin such as phenol resin or epoxy resin in order to make the resin in a semi-cured state, and by sticking and laminating the copper foil onto one side or both sides of the prepreg.

Further, in case of manufacturing a copper-clad laminate having three layers or more which is categorized as a multilayer printed wiring board, the copper-clad laminate is manufactured by once performing the conductive circuit formation on a surface of the copper-clad laminate to make an internal layer base material, and by sticking the copper foil onto the both sides of the internal layer base material via the prepreg, for example.

In recent years, with the downsizing and greater packaging density of the printed wiring board, it has become common to provide fine blind holes, i.e., via holes, on a surface of the printed wiring board. As a method for forming this via holes, laser beam machining or plasma machining, for example, may be used. At this time, in a state that inorganic components like glass fibers are contained as frame materials in an insulating layer of the copper-clad laminate (for example, this state corresponds to a case of an insulating layer being comprised of a glass-epoxy prepreg which is referred to as an FR-4 base material.), the inorganic components as framework materials will affect the processability despite the ease of sublimation and evaporation of the resin component which are caused by the laser beam or plasma. Consequently, in order to allow uniform perforating, the insulating layer is frequently fabricated only with the resin components without employing the framework materials, to be used. Also, nonexistence of the frame materials results in a capability of eliminating influences of unevenness or ridges formed at a surface of the frame materials on a flatness of the copper-clad laminate, so that an extremely flat surface can be obtained. For example, as for the above described FR-4 substrate, cloth grains of the glass cloth which is a framework material of the insulating layer develop on a surface of outer layer copper foil of the copper-clad laminate after being subjected to the hot press molding, so that in case of fabricating a thin resist layer such as a liquid resist, variations occur in a thickness of the resist layer, which consequently deteriorates a width precision of an etched circuit. Therefore, these problems can be resolved by eliminating the framework materials.

In case of fabricating an insulating layer of a copper-clad laminate without including framework materials, manufacture of a multilayer copper-clad laminate is performed by any one of the following methods: (1) a method characterized in that a liquid resin is coated on a surface of an internal layer substrate and copper foil is stuck onto the resin, (2) a method characterized in that a resin film being comprised of a thermosetting resin in a semi-cured state is sandwiched between an inner layer substrate and copper foil to be stuck thereto, in order to perform thermoforming, (3) a method wherein resin applied-copper foil, i.e., copper foil having a resin layer formed thereon, is directly stuck to a surface of an inner layer substrate, or the like. Then the resultant product undergoes formation of the so-called outer layer circuits or formation of via holes, to be processed into a printed wiring board.

The above described method (1) has some problems, that is, it is difficult to more precisely and uniformly coat the liquid resin on a surface of the inner layer substrate on which inner layer circuits are already formed and uneven configurations are also formed, and in case of performing interlayer conducting plating when forming through holes or the like, it takes much time for grinding and removing the resin content which is deposited on an inner wall of the perforation or hole portion. And the resin film used in the above described method (2) is manufactured by coating a resin composition on a plastic film, however, costly plastic films to be discarded after its usage become enormous and thus a large amount of wastes are generated, so that from the view point of the environmental protection, this method is unacceptable in the present society wherein the environmental protection is taken very seriously.

Therefore, considering from the various view points, we have reached a conclusion that it is most advantageous to use resin applied-copper foil, and the above described method (3) is becoming widely and commonly pervasive. As a resin content used for the resin applied-copper foil, epoxy resins are frequently used. As for this resin applied-copper foil, the inventors have already proposed various resin applied-copper foil which are favorable for manufacturing the copper-clad laminate used for the printed wiring boards as a result of our intensive studies, and have widely contributed to the manufacture of high density printed wiring boards because manufacturing the printed wiring boards with the use of this resin applied-copper foil allows easy forming of via holes or the like employing the laser processing method as well as forming of stable fine pitch circuits.

The copper-clad laminate manufactured by the use of such a resin applied-copper foil, when used for the printed wiring board, has practically satisfiable heat resistance, electric characteristics, and chemical resistant characteristics and has been widely supplied to the market.

As a resin used for the formation of resin layers of resin applied-copper foil which has conventionally been supplied to the market, epoxy halide resins or halogen based flame retarders are used in order to impart the flame retardancy. As for the demands for flame retardancy, it is required also from a viewpoint of the PL Standards or the like to meet a certain criterion such that the ignition will not occur for the purpose of safety in electronic and electric equipment at the time of their usage.

As the criteria for this flame retardancy, there are various quality standards for the printed wiring boards, and each of home electrical products manufacturers and industrial electronics manufacturers etc. may often adopt its original criterion. Among others, a criterion defined in section 18 of the UL 796 which is also commonly referred to as "the UL Standards", defining whether an item can be designated as a subject matter of insurance by the U.S. insurance company, has become a de facto standard as a practical global standard, and this criterion is one of the very important quality standards for the printed wiring boards. An evaluation test of the flame retardancy is conducted for a substrate from which noncombustible copper foil is removed after a copper-clad laminate is manufactured. Therefore, a problem is not a flame retardancy required for the resin applied-copper foil itself, but a flame retardancy required for the copper-clad laminate from which the copper foil is removed, that is, the flame retardant characteristics of the resin layer of the resin applied-copper foil which remains on the substrate side becomes a problem.

However, halogen elements added to the resin used for formation of the resin layers of the resin applied-copper foil has been reported to have an opportunity to generate toxic compounds during the combustion treatment after being discarded, so that it has been required to develop resin compounds and resin applied-copper foil etc. which are free of halogen based flame retarders.

In order to try to solve this problem, as an alternative to the halogen based flame retardar, it has been proposed to add inorganics such as phosphorous compounds represented by red phosphorous or phosphoric ester and metal hydroxides to the resin.

On the other hand, it has been pointed out that water resistance and heat resistance of the resin become worse when the phosphorous compounds are used, so that there is a possibility that the safety reliability of the printed wiring boards at the time of their manufacturing process and their usage is deteriorated. Further, the resin composition becomes hard and brittle when the metal hydroxide is used and the peel strength between the resin and the copper foil is substantially reduced, consequently there has been a problem that faulty adherence occurs between the base material and the copper foil.

Therefore, it has been required to be able to form a resin layer of resin applied-copper foil employing a resin compound which is free of halogen elements and to manufacture a copper-clad laminate without any of above described problems, and to provide high flame retardancy, excellent water resistance and heat resistance, and good peel strength between a base material and copper foil.

DISCLOSURE OF THE INVENTION

Hence, the inventors have developed a resin compound which will be described hereinafter and also developed a resin sheet and resin applied-copper foil which use this resin compound as a result of our intensive studies. Further, manufacturing a copper-clad laminate by the use of above described materials allows a printed wiring board to be provided which is excellent in both characteristics, that is, heat resistance and flame resistance.

Firstly, the present invention as set forth in claim 1 is a resin compound for fabricating an interlayer dielectric of a printed wiring board, wherein the resin compound has a composition comprising an epoxy based resin which includes an epoxy resin curing agent having 5 to 25% by weight of nitrogen and maleimide compounds which have thermosetting properties (possible to limit the content?)and being free of halogen elements, and that the resin compound is formed by dissolving the composition in an organic solvent.

According to the present invention, when the nitrogen content in the curing agent within components of the epoxy based resin which constitutes the resin compound for fabricating the interlayer dielectric is 5 to 25% by weight, good performance can be delivered in terms of the flame retardancy and the water absorption, so that the selective usage of proper curing agent for the epoxy based resin allows the cured epoxy resin to have a self-digesting characteristic. In addition, the present invention is to provide a resin compound for fabricating an interlayer dielectric having higher heat resistance and flame retardancy, in combination with the use of maleimide compounds having higher flame retardancy by itself with a thermosetting property. Further, this composition makes it possible to eliminate halogen elements represented by chlorine etc. which are added to the compound in order to impart the flame retardancy, so that it becomes possible to reduce loads to the natural environment in a stage of discarding the copper-clad laminate and the printed wiring board.

The resin compound for fabricating the interlayer dielectric as set forth in claim 1 is described as one basically comprised of the epoxy based resin and the maleimide compounds. The epoxy based resin as described herein means a resin which uses epoxy resins as a base material and contains at least a resin curing agent required for curing the epoxy resin, and is also assumed to include other resin components such as melamine resin or phenol resin, an accelerator, an antifoaming agent, and a leveling agent, etc. which are added as necessary. These additional components can control the curing rate of the resin and produce an effect of the cost reduction. This is because, as a general concept in the chemical context, it becomes impossible to readily conduct the curing of the epoxy resin if the epoxy resin curing agent is not included. The maleimide compounds mentioned in the present invention will be described in detail in a description of the resin compound for fabricating the interlayer dielectric as set forth in claim 2.

In claim 1, a sentence "comprising an epoxy based resin which includes an curing agent having 5 to 25% by weight of nitrogen and maleimide compounds which have thermosetting properties" is described. This sentence is described as a concept including not only a resin compound for fabricating an interlayer dielectric obtained by mixing "an epoxy based resin which includes a curing agent having 5 to 25% by weight of nitrogen" with "maleimide compounds which have thermosetting properties" each of which is separately produced but also a resin compound for fabricating an interlayer dielectric obtained by simultaneously adding the maleimide compounds when the epoxy resin and the above described epoxy resin curing agent, etc. are dissolved. That is, there is no particular restrictions on the order of mixing the constituent compounds when producing the resin compound used for fabricating the interlayer dielectric.

A solvent used for the dissolution will be described in the following description of a method for manufacturing. The above described resin compound for fabricating the interlayer dielectric is used for forming an insulating resin layer between the copper foil circuit layers of the copper-clad laminate.

In addition, as defined in claim 2 that the resin used for fabricating the interlayer dielectric of the printed wiring board as set forth in claim 1, wherein the epoxy based resin comprises epoxy resins having two or more glycidyl groups per molecule, polymers having crosslinkable functional groups within a molecule, a crosslinker which is added as necessary, and a phenol novolak epoxy resin curing agent containing triazine rings within a molecule, it is desirable to use the resins described above as epoxy resins used in the present invention.

An epoxy resin having two or more glycidyl groups per molecule is used as the epoxy resin. If an epoxy resin having one glycidyl group per molecule is used, a crosslinking state of the resin tends to be insufficient and results in lowering of the flame retardancy, so that an object of the present invention cannot be achieved. Although an epoxy resin which is generally used for electric and electronic materials can be used without any particular restrictions as far as the above described condition is satisfied, an epoxy resin which is substantially free of halogens is preferable to be used in this context.

An epoxy resin having two or more glycidyl groups per molecule is desirably 20 to 70 parts by weight given that the total amount of the resin compound is 100 parts by weight. If the blending proportion of the epoxy resin is less than 20 parts by weight, the adhesive property between the copper foil and the base material after being processed to the copper-clad laminate becomes lower and the peel strength also tends to be decreased. By contrast, if the blending proportion of the epoxy resin is 70 parts by weight or more, flowablilty of the resin compound becomes too much to treat the compound, so that it becomes difficult to control a layer thickness when a resin layer is formed on the copper foil or a resin sheet described below is manufactured.

Therefore, as defined in claim 3 that the resin used for fabricating the interlayer dielectric of the printed wiring board as set forth in claim 2, wherein the epoxy resins having two or more glycidyl groups per molecule are free of halogen elements and are any one or more of bisphenol A epoxy resin, bisphenol F epoxy resin, novolak epoxy resin, cresol novolak epoxy resin, and glycidylamine epoxy resin, the epoxy resins described herein which are free of halogen elements are most preferable to be used. These are capable of exploiting the most stable substrate performance from a broad view in an application for manufacturing the printed wiring board, in terms of not only the flame resistance but also various characteristics including the peel strength between the base material and the copper foil and the chemical resistance.

"Polymers having crosslinkable functional groups within a molecule" in a sentence "polymers having crosslinkable functional groups within a molecule and a crosslinker which is added as necessary" as set forth in claim 2 is used for preventing cracks from occurring in a resin layer when the resin compound is coated on the copper foil to form the resin layer on the copper foil and processed to a resin applied-copper foil, preventing resin powder from scattering at the time of cutting and crushing after being processed to the copper-clad laminate, and ensuring a certain range of flowability by performing the viscosity control of the resin compound before forming the resin layer.

As for the polymers, as defined in claim 4, it is preferable to use any one or more of polyether sulfone resin having a hydroxyl group at a terminal, polyvinyl acetal resin having repeated hydroxyl groups within a molecule, and phlenoxy resin, as the polymers which have crosslinkable functional groups within a molecule.

There is not necessary to particularly limit the polymer as described above as far as the polymer corresponds to the above described polyether sulfone resin having a hydroxyl group at a terminal, polyvinyl acetal resin having repeated hydroxyl groups within a molecule, or phenoxy resin. If a sufficient crosslinking reaction can be allowed to proceed by the use of polymer with crosslinkable functional groups within a molecule such as the hydroxyl groups in the polymers described above, highly excellent heat resistance can be imparted to the copper-clad laminate or the printed wiring board being manufactured by using thereof, even when the resin compound is cured and becomes a part of the copper-clad laminate. Therefore, in case of using a resin compound which uses a polymer having no crosslinkable functional groups within a molecule, the heat resistance after curing the resin compound becomes significantly lower, so that the compound may not be used.

In addition, the polymer having crosslinkable functional groups within a molecule is desirable to be in a range of 5 to 30 parts by weight given that the total amount of the resin compound is 100 parts by weight. The effects of preventing cracks from occurring and preventing the resin powder from scattering cannot be produced when the polymer is less than 5 parts by weight, whereas the flowability of the resin becomes too low when the polymer is 30 parts by weight or more, so that controlling the layer thickness becomes difficult when the resin layer is formed on the copper foil or when a resin sheet described below is manufactured, as in the case where the amount of epoxy resin becomes excessive.

"A crosslinker which is added as necessary" is used depending on a kind of polymer, that is, blocked isocyanate is used for bisphenol A epoxy resin for example and other crosslinkers should be considered to be used as appropriate, so that there is not necessary to impose particular limitations on the above described crosslinkers. In addition, the present invention does not always use the crosslinker. Because, in case of using polyether sulfone resin as a polymer for example, a crosslinking reaction with the epoxy resin can be conducted without adding the crosslinker separately.

"As a phenol novolak epoxy resin curing agent containing triazine rings within a molecule" as set forth in claim 2, one comprised of one or two of melamine and benzoguanamine and a compound obtained from a condensation reaction of phenols and formaldehyde, and having 5 to 25% by weight of nitrogen content is most preferably employed as defined in claim 5. More specifically, the curing agent is, for example, an AT novolak resin having a trade name of LA-7054 manufactured by Dainippon Ink Inc. The resin compound according to the present invention, which uses the above described compounds as a curing agent of the epoxy resin, provides a self-digesting characteristic.

The usage amount of the phenol novolak epoxy resin curing agent which contains triazine rings within a molecule should not be specified to a certain amount which is particularly limited because this amount is calculated from an equivalent ratio to the epoxy resin to be used and from experimental data.

As maleimide compounds, it is most preferable to use maleimide compounds having thermosetting properties as set forth in claim 6. That is, the compounds are, for example, N,N'-(diphenylmethane)bismaleimide, bis(3-ethyl-5-methyl-4-maleimide)methane, and 2,2-bis[4-(4-maleimidephenoxy)phenyl]propane. Still further, it is possible to obtain good results by the use of a thermosetting maleimide compound which can be obtained by Michael addition reaction of the above described maleimide compound with polyamides.

A content of the maleimide compound having a thermosetting property in the resin compound according to the present invention is desirable to be 10 to 50 parts by weight given that a total amount of the resin compound is 100 parts by weight. If the maleimide compound is less than 10 parts by weight, an intended sufficient flame retardancy cannot be obtained when the resin compound according to the present invention is cured as an insulating layer of the copper-clad laminate. By contrast, if 50 parts by weight or more of the maleimide compound is used, the cured resin becomes extremely brtittle and its mechanical characteristics also become worse, so that the reliability for shock resistance or load capacity etc. of the resultant printed wiring board is compromised. Such a worsening in the mechanical characteristics becomes an extremely critical defect for a printed wiring board to which a load of a flyback transformer having several kilograms of loads is directly applied, such as a mother board being built in a television for example.

The resin compound according to the present invention as described above, which is used as a material for fabricating the interlayer dielectric of the copper-clad laminate, makes it possible to impart excellent heat resistance and flame resistance to a printed wiring board which is obtained from the copper-clad laminate.

As defined in claim 7, a method for producing the resin compound used for fabricating the interlayer dielectric of the printed wiring board as set forth in any of claims 1 to 6, wherein a composition is made to have 20 to 70 parts by weight of epoxy resins, 5 to 30 parts by weight of polymers having crosslinkable functional groups within a molecule, 10 to 50 parts by weight of maleimide compounds having thermosetting properties, and a balance of a crosslinker added as necessary and a phenol novolak epoxy resin curing agent containing triazine rings within a molecule given that a total amount of the resin compound excluding a solvent is 100 parts by weight, and that a solids content after the composition is added to and dissolved in the solvent becomes 30 to 80% by weight, can be derived from the blending proportion used for obtaining the resin compound according to the present invention.

The meanings of blending proportion of respective resin components and a curing agent etc. are as described above. And a reason for defining as "a solids content after the composition is added to and dissolved in the solvent becomes 30 to 80% by weight" in this claim 7 is that a proper viscosity range which is capable of favorably controlling the resin layer thickness can be obtained within this range when a resin applied-copper foil is formed or a resin sheet is formed. That is, if the solids are less than 30% by weight, the viscosity of the resin becomes lower and its flowability becomes too large, so that a coating thickness of the resultant resin layer is excessively reduced. By contrast, if the solids exceed 80% by weight, the viscosity of the resin becomes higher and its flowability becomes too low, so that a coating thickness of the resultant resin layer is excessively increased.

In addition, as a solvent used for obtaining the resin compound according to the present invention, as defined in claim 8, it is preferable to use a mixed solvent of N-methylpyrrolidone and methyl ethyl ketone which has a mixing ratio of N-methylpyrrolidone/methyl ethyl ketone= 50/50 to 40/60 (by weight).

That is, as a solvent generally used for dissolving a resin according to the present invention, it is desirable to use a single component such as methyl ethyl ketone which is readily volatilized during a drying process. However, constituents of the resin according to the present invention include maleimide compounds, so that it is almost impossible to dissolve the compounds with the use of methyl ethyl ketone only. Therefore, the inventors have contemplated the use of the mixed solvent of N-methylpyrrolidone and methyl ethyl ketone.

According to a comparison of a property of this methyl ethyl ketone with that of N-methylpyrrolidone, a boiling point of the methyl ethyl ketone is 79.6° C., whereas a boiling point of the N-methylpyrrolidone is around 200° C. Thus, it can be said that the N-methylpyrrolidone is more resistant to be volatilized than the methyl ethyl ketone. For these reasons, a usage amount of N-methylpyrrolidone should be within a certain range in which the maleimide compounds used for the present invention can be dissolved and should be minimized.

As mentioned above, the inventors have decided as a result of our intensive studies that the maleimide compounds used for the present invention can be readily dissolved in the mixed solvent which includes a certain amount of N-methylpyrrolidone, that is, a ratio of N-methylpyrrolidone/methyl ethyl ketone in the mixed solvent is at least 40/60 (by weight). If the ratio of N-methylpyrrolidone/methyl ethyl ketone exceeds 50/50 (by weight), a volatilization speed which is usually required is not satisfied, so that the industrial productivity is not satisfied.

The following method is contemplated when the interlayer dielectric of the copper-clad laminate is fabricated by the use of these resin compounds. A resin sheet which is processed in a semi-cured state is inserted between an inner layer base material and outer layer copper foil as in the case of employing a prepreg, then subjected to the hot press molding in order to be able to obtain a copper-clad laminate. Therefore, claim 9 defines that the resin compound for fabricating the interlayer dielectric of the printed wiring board as set forth in any of claims 1 to 6 is a resin sheet in a semi-cured state for forming an insulating layer for manufacturing the copper-clad laminate. Further, claim 11 defines that the copper-clad laminate is manufactured by the use of the resin sheet for forming the insulating layer as set forth in claim 9.

The method for processing the resin compound into the resin sheet may be a method for processing the resin compound according to the present invention being in a semi-cured state into a sheet or a method wherein a resin layer having a predetermined thickness is formed on a plastic film as a carrier, and the carrier is peeled off at the time of usage.

Further, claim 10 defines that the resin applied-copper foil with the resin layer formed on a surface of the copper foil by the use of the resin for fabricating the interlayer dielectric of the printed wiring board as set forth in any of claims 1 to 6, and claim 12 defines that the copper-clad laminate is manufactured by the use of the resin applied-copper foil as set forth in claim 10.

The above mentioned matters are claimed because the resin compound according to the present invention can be used for manufacturing the resin applied-copper foil and this resin applied-copper foil can be used for manufacturing the copper-clad laminate.

As for the manufacture of the resin applied-copper foil, a semi-cured resin layer is formed on a surface of the copper foil by coating the resin compound according to the present invention on an adhesive surface of the copper foil to the inner layer base material, with the use of the resin coating apparatus referred to as so-called an edge coater or a roll coater, to a predetermined thickness, then drying the resin compound.

Using this resin applied-copper foil like the common copper foil, it becomes possible to manufacture the copper-clad laminate without the use of materials for fabricating the insulating layer such as a prepreg.

Thus obtained copper-clad laminate, since framework materials are not included as in the case of the FR-4 prepreg, is excellent in surface smoothness, possible to provide good registration, easy to form fine pitch circuits, and excellent in formation accuracy of via holes through the laser machining, and also excellent in heat resistance and flame resistance.

BEST MODE FOR CARRYING OUT THE INVENTION

The present invention is described below in more detail, while describing the examples according to the present invention.

EXAMPLE 1

In this example, a resin compound was obtained through blending 30 parts by weight of a polymer blend, 30 parts by weight of an epoxy resin having two or more glycidyl groups per molecule, 21 parts by weight of a maleimide compound having a thermosetting property, and 19 parts by weight of a phenol novolak epoxy resin curing agent containing triazine rings within a molecule. Each of the blending proportions stated herein shows a proportion based on a solids content.

The polymer blend herein means a mixture of a polymer having crosslinkable functional groups within a molecule and its crosslinker. Specifically, the polymer blend was formed by mixing bisphenol A phenoxy resin, which has hydroxyl groups as functional groups and has a weight average molecular weight of 4800 based on polystyrene included, with blocked isocyanate as the crosslinker (Collonate AP, made by Nihon Polyurethane Inc., trade name), in a ratio of 10:2 (by weight).

As the epoxy resin having two or more glycidyl groups per molecule, O-cresol epoxy resin having an epoxy equivalent of 195 was used.

As the maleimide compound having a thermosetting property, N,N'-(4,4-diphenylmethane)bismaleimide was used.

As the phenol novolak epoxy resin curing agent containing triazine rings within a molecule, LA-7054 (made by Dainippon Ink and Chemicals, Inc. AT novolak resin) was used.

Then, the thus blended above described resin was added to a mixed solvent having a ratio of N-methylpyrrolidone/methyl ethyl ketone=50/50 (by weight), stirred and dissolved so that the solids became 40% by weight, then the resin compound was obtained.

EXAMPLE 2

In manufacture of a resin compound in this example, blending proportions which were basically similar to those used in Example 1 were used. Therefore, only different parts will be described and the same descriptions as in the case of Example 1 will be omitted.

The different part is that polyether sulfone resin having a hydroxyl group at a terminal of the molecule was used instead of the polymer blend used in Example 1. In this case, a crosslinker was not particularly added to the polyether sulfone resin separately because this polyether sulfone resin caused a crosslinking reaction with the epoxy resin without the addition of any crosslinker. This blend was processed into a resin applied-copper foil, then a multilayer copper-clad printed wiring board was obtained according to the method similar to Example 1.

EXAMPLE 3

In this example, a resin compound was produced by making a modification to the blending proportion of a resin used in Example 1, so that in this example, only the blending proportion was different from above-described examples. Therefore, only the blending proportion will be described and the same descriptions as in the previous Examples will be omitted.

The blending proportions were 20 parts by weight of a polymer blend, 40 parts by weight of O-cresol epoxy resin, 26 parts by weight of N,N'-(4,4-diphenylmethane) bismaleimide, and 14 parts by weight of AT novolak resin. The proportions were obtained based on a solids content, which is also the same as in the case of Example 1.

The inventors further manufactured a resin compound which was used for comparing the performance of a resin compound according to the present invention with that of the conventional level. These compounds are described in the following Comparative Examples 1 to 3.

Comparative Example 1

A resin compound was obtained by employing the same kind of resin as used in Example 1 and by making a modification to the blending proportion of each resin as follows.

The blending proportions in this case were 30 parts by weight of a polymer blend, 43 parts by weight of O-cresol epoxy resin, and 27 parts by weight of AT novolak resin. These values were also obtained based on a solids contet.

Comparative Example 2

A resin compound was obtained by the use of polyether sulfone having no reactive functional groups instead of the polymer blend used for Example 1. The blending proportions and the manufacturing conditions in this case were the same as those of Example 1.

Comparative Example 3

A resin compound was obtained by the use of a commercially available cresol novolak epoxy resin curing agent instead of AT novolak resin used for Example 1. The blending proportions and the manufacturing conditions in this case were the same as those of Example 1.

In order to verify the performance of the resin compounds obtained in the above-described Examples 1 to 3 and Comparative Examples 1 to 3, each of these resin compounds was coated on a matte side of electrolytic copper foil having a nominal thickness of 18 $\mu$m, then air-dried, and heated at 160° C. for 5 minutes to obtain a resin applied-copper foil having a semi-cured resin layer. The thickness of the resin layer at this time was 80 to 82 $\mu$m. This resin applied-copper foil was laminated to both sides of the FR-4 inner layer base material (a core thickness 0.5 mm, copper foil thickness 35 $\mu$m) on which a predetermined circuit was formed, through the hot press molding. The resin applied-copper foil was overlaid such that its resin layer was in contact with the inner layer base material, and subjected to the hot press molding for two hours with applying a pressure of 20 kgf/cm$^2$ and under the temperature of 180° C., then a multilayer copper-clad laminate having four copper foil layers was obtained.

Then this multilayer copper-clad laminate was used to carry out the flammability test based on the UL796 Standards and the UL94 in order to compare their flame resistance. Procedures of this test carried out was as follows. A sample for the flammability test took a size of 127 mm in length and 12.7 mm in width, and was processed to be in a smooth shape at its edge portion. At this time, the copper foil which was a conductive material having a nominal thickness of 18 μm and was disposed as an outer layer was etched off, so that the sheet thickness after removing the outer layer copper foil was 150 μm.

In order to evaluate the heat resistance, a soldering bus at a temperature of 260° C. was used to carry out the soldering heat test based on section 5.5 of the JIS C 6481 without the outer layer copper foil being removed, and a time that the copper-clad laminate was blistered was measured.

The result is shown in Table 1. As can be seen from this table, when Comparative Examples 1 to 3 are compared with Examples 1 to 3, there are no samples which have both of the soldering heat resistance and the flame resistance in case of Comparative Examples, whereas samples in case of Examples have both characteristics of the soldering heat resistance and the flame resistance, so that it becomes possible to manufacture a copper-clad laminate being excellent in its total balance.

TABLE 1

| Sample | Soldering Heat Resistance Second | Flame Resistance (UL Flammability Test) Grade |
|---|---|---|
| First Embodiment | 120 or more | 94V-0 |
| Second Embodiment | 120 or more | 94V-0 |
| Third Embodiment | 120 or more | 94V-0 |
| Comparative Example 1 | 120 or more | 94V-1 |
| Comparative Example 2 | 20 | 94V-0 |
| Comparative Example 3 | 120 or more | 94V-1 |

The 94V-0 grade which represents the flame resistance is defined as follows. That is, the copper-clad laminate sample is firstly contacted to a flame of a burner for 9.5 to 10.5 seconds under the conditions defined in the standard, then an after-flaming time ($t_1$) which is the time required until the flame is extinguished after the burner is separated from the sample by a predetermined distance, an after-flaming time ($t_2$) after the sample is secondary contacted to the flame of the burner in the same manner as described above, and a smoke-remaining time ($t_3$) are measured. In this case, the 94V-0 grade means that each of five samples making a set satisfies the following conditions: both of $t_1$ and $t_2$ are 10 seconds or less, $t_1+t_2$ is 50 seconds or less, $t_2+t_3$ is 30 seconds or less; flame or smoke which remains at a clamp holding the sample cannot be observed, and inflammable substance or dropping cannot be found in a predetermined cotton which is used as a pilot.

By contrast, 94V-1 grade is defined as follows. That is, the copper-clad laminate sample is firstly contacted to a flame of a burner for 9.5 to 10.5 seconds under the conditions defined in the standard, then an after-flaming time ($t_1$) which is the time required until the flame is extinguished after the burner is separated from the sample by a predetermined distance, an after-flaming time ($t_2$) after the sample is secondary contacted to the flame of the burner in a similar manner as above, and a smoke-remaining time ($t_3$) are measured. In this case, the 94V-1 grade means that each of five samples making a set satisfies the following conditions: both of $t_1$ and $t_2$ are 30 seconds or less, $t_1+t_2$ is 250 seconds or less, $t_2+t_3$ is 60 seconds or less; flame or smoke which remains at a clamp holding the sample cannot be observed, and inflammable substance or dropping cannot be found in a predetermined cotton which is used as a pilot. Therefore, the flame resistance for the 94V-0 grade is more critical than that for the 94V-1, so that the copper-clad laminate using the resin compound according to the present invention is found to be excellent in its heat resistance and to have high flame retardancy.

Industrial Applicability

Fabricating an interlayer dielectric of a copper-clad laminate by the use of a resin compound according to the present invention largely improves both of the heat resistance and the flame resistance regarding to the copper-clad laminate or a printed wiring board, makes it possible to form a fine-pitch circuit and to provide a copper-clad laminate on which laser perforating is easily conducted, and further allows the safety reliability during a manufacturing process and at the usage of the printed wiring board to be extremely high. Therefore, inflammable accidents happened to home electrical products and to various kinds of electronic products can be prevented, and products can be supplied in excellent condition also from a viewpoint of the product liability. Still further, the resin compound according to the present invention is free of halogen elements, so that the compound id desirable also from a viewpoint of the natural environmental protection.

What is claimed is:

1. A resin composition used for fabricating an interlayer dielectric of a printed wiring board, wherein said composition comprises; a) an epoxy based resin; b) an epoxy resin curing agent containing 5 to 25% by weight nitrogen; c) maleimide compounds having thermosetting properties; d) polymers having crosslinkable functional groups within a molecule; and e) a crosslinker, which is added if necessary, wherein said resin composition is free of halogen.

2. The resin composition used for fabricating an interlayer dielectric of a printed wiring board according to claim 1, wherein said epoxy based resin comprises epoxy resins having two or more glycidyl groups per molecule, and said epoxy resin curing agent comprises a phenol novolak epoxy resin curing agent containing triazine rings within a molecule.

3. The resin composition used for fabricating an interlayer dielectric of a printed wiring board according to claim 1, wherein said epoxy based resin is selected from the group consisting of bisphenol A epoxy resin, bisphenol F epoxy resin, novolak epoxy resin, cresol novolak epoxy resin, glycidylamine epoxy resin, and combinations thereof.

4. The resin composition used for fabricating an interlayer dielectric of a printed wiring board according to claim 1, wherein said polymers having crosslinkable functional groups are selected from the group consisting of polyether sulfone resin having a terminal hydroxyl group, polyvinyl acetal resin having repeated hydroxyl groups, phenoxy resin, and combinations thereof.

5. The resin composition used for fabricating an interlayer dielectric of a printed wiring board according to claim 1, wherein said epoxy resin curing agent is a phenol novolak epoxy-curing agent comprising (a) one or two of melamine and benzoguanamine, and (b) a compound obtained from a condensation reaction of phenols and formaldehydes wherein the phenol novolak epoxy-resin curing agent has a nitrogen content of 5 to 25 wt %.

6. The resin composition used for fabricating an interlayer dielectric of a printed wiring board according to claim 1, wherein said maleimide compounds are selected from the group consisting of N,N'-(4,4-diphenylmethane) bismaleimide; bis(3-ethyl-5-methyl-4-maleimidephenyl) methane; 2,2-bis[4-(4-maleimidephenoxy)phenyl]propane; thermosetting maleimide compounds obtained from Michael addition reaction of these maleimide compounds and polyamines; and combinations thereof.

7. A resin sheet for forming an insulating layer used for manufacturing a copper-clad laminate, wherein the resin compound for fabricating an interlayer dielectric of the printed wiring board as set forth in claim 1 is made into a sheet which is in a semi-cured state.

8. A copper-clad laminate comprising copper foil and the resin sheet according to claim 7.

9. A resin applied-copper foil constituted by forming a resin layer on a surface of copper foil employing the resin compound for fabricating an interlayer dielectric of a printed wiring board as set forth in claim 1.

10. A copper-clad laminate comprising copper foil and the resin applied-copper foil according to claim 9.

11. A method for producing a resin composition used for fabricating an interlayer dielectric of a printed wiring board, wherein said resin composition is added to and dissolved in the solvent to a solids content of 40 to 50% by weight, wherein 100 parts of said resin composition comprises: 20 to 70 parts by weight of an epoxy based resin; 10 to 50 parts by weight of maleimide compounds having thermosetting properties; 5 to 30 parts by weight of polymers having crosslinkable functional groups within a molecule; and balance being a crosslinker added as necessary and a phenol novolak epoxy resin curing agent containing triazine rings within a molecule, wherein the phenol novolak epoxy-resin curing agent has a nitrogen content of 5 to 25 wt %.

12. A method for producing the resin composition used for fabricating an interlayer dielectric of a printed wiring board according to claim 11, wherein the solvent is a mixed solvent of N-methylpyrrolidone and methyl ethyl ketone, the mixing weight ratio of N-methylpyrrolidone/methyl ethyl ketone being in a range of 50/50 to 40/60.

13. A resin composition used for fabricating an interlayer dielectric of a printed wiring board, wherein said composition, comprises; a) an epoxy based resin comprising epoxy resins having two or more glycidyl groups per molecule; b) a phenol novolak epoxy resin curing agent containing triazine rings within a molecule; c) maleimide compounds having thermosetting properties; d) polymers having crosslinkable functional groups within a molecule; and e) a crosslinker, which is added if necessary; wherein the phenol novolak epoxy resin curing agent has a nitrogen content of 5 to 25 wt % and said resin composition is free of halogen.

14. The resin composition used for fabricating an interlayer dielectric of a printed wiring board according to claim 13, wherein said epoxy based resin is selected from the group consisting of bisphenol A epoxy resin, bisphenol F epoxy resin, novolak epoxy resin, cresol novolak epoxy resin, glycidylamine epoxy resin, and combinations thereof.

15. The resin composition used for fabricating an interlayer dielectric of a printed wiring board according to claim 13, wherein said polymers having crosslinkable functional groups are selected from the group consisting of polyether sulfone resin having a terminal hydroxyl group, polyvinyl acetal resin having repeated hydroxyl groups, phenoxy resin, and combinations thereof.

16. The resin composition used for fabricating an interlayer dielectric of a printed wiring board according to claim 13, wherein said epoxy resin curing agent is selected from the group consisting of melamine, benzoguanamine, a compound obtained from a condensation reaction of phenols and formaldehydes; and combinations thereof.

17. The resin composition used for fabricating an interlayer dielectric of a printed wiring board according to claim 13, wherein said maleimide groups are selected from the group consisting of N,N'-(4,4-diphenylmethane) bismaleimide; bis(3-ethyl-5-methyl-4-maleimidephenyl) methane; 2,2-bis[4-(4maleimidephenoxy)phenyl]propane; thermosetting maleimide compounds obtained from Michael addition reaction of these maleimide compounds and polyamines; and combinations thereof.

18. A method, for producing a resin composition used for fabricating an interlayer dielectric of a printed wiring board, according to claim 13, wherein said resin composition is added to and dissolved in the solvent to a solids content of 40 to 50% by weight, wherein 100 parts of said resin composition comprises: 20 to 70 parts by weight of an epoxy based resin comprising epoxy resins having two or more glycidyl groups per molecule; 10 to 50 parts by weight of maleimide compounds having thermosetting properties; 5 to 30 parts by weight of polymers having crosslinkable functional groups within a molecule; and a balance being a crosslinker added as necessary and a phenol novolak epoxy resin curing agent containing triazine rings within a molecule.

19. A method for producing the resin composition used for fabricating an interlayer dielectric of a printed wiring board according to claim 18, wherein the solvent is a mixed solvent of N-methylpyrrolidone and methyl ethyl ketone, the mixing weight ratio of N-methylpyrrolidone/methyl ethyl ketone being in a range of 50/50 to 40/60.

20. A printed wiring board comprising a plurality of layers including an interlayer dielectric, the interlayer dielectric comprising a resin composition, wherein said composition comprises; a) an epoxy based resin; b) an epoxy resin curing agent containing 5 to 25% by weight nitrogen; c) maleimide compounds having thermosetting properties; d) polymers having crosslinkable functional groups within a molecule; and e) a crosslinker, which is added if necessary, wherein said resin composition is free of halogen.

21. A printed wiring board comprising a plurality of layers including an interlayer dielectric, the interlayer dielectric comprising a resin composition, wherein said composition comprises; a) an epoxy based resin comprising epoxy resins having two or more glycidyl groups per molecule; b) a phenol novolak epoxy resin curing agent containing triazine rings within a molecule; c) maleimide compounds having thermosetting properties; d) polymers having crosslinkable functional groups within a molecule; and e) a crosslinker, which is added if necessary; wherein said resin composition is free of halogen, wherein the phenol novolak epoxy resin curing agent has a nitrogen content of 5 to 25 wt %.

* * * * *